(12) United States Patent
Khan et al.

(10) Patent No.: US 8,183,687 B2
(45) Date of Patent: May 22, 2012

(54) INTERPOSER FOR DIE STACKING IN SEMICONDUCTOR PACKAGES AND THE METHOD OF MAKING THE SAME

(75) Inventors: Rezaur Rahman Khan, Rancho Santa Margarita, CA (US); Sam Ziqun Zhao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 720 days.

(21) Appl. No.: 11/707,026

(22) Filed: Feb. 16, 2007

(65) Prior Publication Data

US 2008/0211089 A1    Sep. 4, 2008

(51) Int. Cl.
*H01L 23/34* (2006.01)

(52) U.S. Cl. ........ 257/723; 257/686; 257/678; 257/690; 257/713; 257/719; 257/777; 257/784; 257/E23.052; 257/E23.039

(58) Field of Classification Search .................. 257/723, 257/686, 678, 690, 713, 719, 777, 784, E23.052, 257/E23.039
See application file for complete search history.

(56) References Cited

U.S. PATENT DOCUMENTS

| | | | |
|---|---|---|---|
| 4,480,262 A | 10/1984 | Butt | |
| 4,560,826 A | 12/1985 | Burns et al. | |
| 4,680,613 A | 7/1987 | Daniels et al. | |
| 4,803,544 A | 2/1989 | Holzschuh et al. | |
| 5,105,260 A | 4/1992 | Butera | |
| 5,153,379 A | 10/1992 | Guzuk et al. | |
| 5,294,826 A | 3/1994 | Marcantonio et al. | |
| 5,350,943 A | 9/1994 | Angerstein et al. | |
| 5,376,756 A | 12/1994 | Kwon | |
| 5,389,816 A | 2/1995 | Shimizu et al. | |
| 5,468,910 A | 11/1995 | Knapp et al. | |
| 5,486,720 A | 1/1996 | Kierse | |
| 5,497,032 A | 3/1996 | Tsuji et al. | |
| 5,559,306 A | 9/1996 | Mahulikar | |
| 5,608,265 A | 3/1997 | Kitano et al. | |
| 5,642,261 A | 6/1997 | Bond et al. | |
| 5,650,659 A | 7/1997 | Mostafazadeh et al. | |
| 5,668,406 A | 9/1997 | Egawa | |
| 5,889,316 A | 3/1999 | Strobel et al. | |

(Continued)

OTHER PUBLICATIONS

Dreiza et al., "Implement stacked package-on-package designs", Amkor Technology Inc., retrieved from the internet on Oct. 17, 2005 http://www.eetasia.com/ARTICLES/2005OCT/B/2005OCT17_EDA_MFG_TA.pdf., pp. 1-3.

(Continued)

*Primary Examiner* — Junghwa M Im
(74) *Attorney, Agent, or Firm* — Sterne, Kessler, Goldstein & Fox P.L.L.C.

(57) ABSTRACT

Methods and apparatus for improved electrical, mechanical and thermal performance of stacked IC packages are described. An IC package comprises a substrate, a first die, a second die, and an interposer with an opening in a first surface of the interposer configured to accommodate the first die. The first IC die is attached a first surface of the substrate. The interposer is mounted on the first surface of the substrate such that the first IC die is placed within the opening in the interposer. The second die is mounted on a second surface of the interposer. Wire bonds couple bond pads on the first surfaces of IC die are coupled to the first surface of the substrate. A mold compound encapsulates the first IC die, the second IC die, the interposer and the wire bonds.

24 Claims, 15 Drawing Sheets

U.S. PATENT DOCUMENTS

| | | | |
|---|---|---|---|
| 5,977,626 A | 11/1999 | Wang et al. | |
| 5,986,340 A | 11/1999 | Mostafazadeh et al. | |
| 6,011,303 A | 1/2000 | Tanaka et al. | |
| 6,092,281 A | 7/2000 | Glenn | |
| 6,229,702 B1 | 5/2001 | Tao et al. | |
| 6,395,582 B1 | 5/2002 | Sohn et al. | |
| 6,432,742 B1 | 8/2002 | Guan et al. | |
| 6,501,184 B1 | 12/2002 | Shin et al. | |
| 6,528,876 B2 | 3/2003 | Huang | |
| 6,552,428 B1 | 4/2003 | Huang et al. | |
| 6,603,072 B1* | 8/2003 | Foster et al. | 174/536 |
| 6,614,102 B1 | 9/2003 | Hoffman et al. | |
| 6,617,200 B2 | 9/2003 | Sone | |
| 6,707,140 B1 | 3/2004 | Nguyen et al. | |
| 6,737,750 B1 | 5/2004 | Hoffman et al. | |
| 6,775,140 B2 | 8/2004 | Shim et al. | |
| 6,825,108 B2 | 11/2004 | Khan et al. | |
| 6,838,761 B2 | 1/2005 | Karnezos | |
| 6,848,912 B2 | 2/2005 | Zhang | |
| 6,861,750 B2 | 3/2005 | Zhao et al. | |
| 6,876,553 B2 | 4/2005 | Zhao et al. | |
| 6,879,039 B2 | 4/2005 | Khan et al. | |
| 6,882,042 B2 | 4/2005 | Zhao et al. | |
| 6,887,741 B2 | 5/2005 | Zhao et al. | |
| 6,906,414 B2 | 6/2005 | Zhao et al. | |
| 6,919,630 B2 | 7/2005 | Hsiao | |
| 6,989,593 B2 | 1/2006 | Khan et al. | |
| 7,005,737 B2 | 2/2006 | Zhao et al. | |
| 7,015,072 B2 | 3/2006 | Combs et al. | |
| 7,026,711 B2 | 4/2006 | Lee et al. | |
| 7,038,312 B2 | 5/2006 | Khan et al. | |
| 7,057,277 B2 | 6/2006 | Chen et al. | |
| 7,061,102 B2 | 6/2006 | Eghan et al. | |
| 7,078,806 B2 | 7/2006 | Khan et al. | |
| 7,094,060 B2 | 8/2006 | Zhang | |
| 7,102,225 B2 | 9/2006 | Khan et al. | |
| 7,132,744 B2 | 11/2006 | Zhao et al. | |
| 7,148,084 B2 | 12/2006 | Strobel et al. | |
| 7,161,239 B2 | 1/2007 | Zhao et al. | |
| 7,168,957 B2 | 1/2007 | Zhang | |
| 7,196,415 B2 | 3/2007 | Zhong et al. | |
| 7,198,987 B1 | 4/2007 | Warren et al. | |
| 7,202,559 B2 | 4/2007 | Zhao et al. | |
| 7,227,256 B2 | 6/2007 | Zhao et al. | |
| 7,241,645 B2 | 7/2007 | Zhao et al. | |
| 7,245,500 B2 | 7/2007 | Khan et al. | |
| 7,259,445 B2 | 8/2007 | Lau et al. | |
| 7,259,448 B2 | 8/2007 | Zhang et al. | |
| 7,259,457 B2 | 8/2007 | Zhang et al. | |
| 7,271,479 B2 | 9/2007 | Zhao et al. | |
| 7,312,108 B2 | 12/2007 | Zhao et al. | |
| 7,326,061 B2 | 2/2008 | Zhang | |
| 2002/0024137 A1 | 2/2002 | Olofsson et al. | |
| 2002/0079572 A1 | 6/2002 | Khan et al. | |
| 2002/0190361 A1 | 12/2002 | Zhao et al. | |
| 2003/0057550 A1 | 3/2003 | Zhao et al. | |
| 2003/0111728 A1 | 6/2003 | Thai et al. | |
| 2003/0146509 A1* | 8/2003 | Zhao et al. | 257/738 |
| 2003/0178719 A1 | 9/2003 | Combs et al. | |
| 2004/0038447 A1 | 2/2004 | Corisis et al. | |
| 2004/0084771 A1 | 5/2004 | Bolken et al. | |
| 2004/0178499 A1 | 9/2004 | Mistry et al. | |
| 2005/0029657 A1 | 2/2005 | Khan et al. | |
| 2005/0035452 A1 | 2/2005 | Zhang et al. | |
| 2005/0077545 A1 | 4/2005 | Zhao et al. | |
| 2005/0127501 A1 | 6/2005 | Khan et al. | |
| 2005/0280127 A1 | 12/2005 | Zhao et al. | |
| 2005/0280139 A1* | 12/2005 | Zhao et al. | 257/704 |
| 2005/0280141 A1 | 12/2005 | Zhang | |
| 2006/0012037 A1 | 1/2006 | Raedt et al. | |
| 2006/0043559 A1* | 3/2006 | Chow et al. | 257/686 |
| 2006/0065972 A1 | 3/2006 | Khan et al. | |
| 2006/0091542 A1 | 5/2006 | Zhao et al. | |
| 2006/0166397 A1 | 7/2006 | Lau et al. | |
| 2006/0249826 A1* | 11/2006 | Foong et al. | 257/685 |
| 2006/0279943 A1* | 12/2006 | Akram et al. | 361/820 |
| 2007/0007644 A1 | 1/2007 | Zhao et al. | |
| 2007/0045824 A1 | 3/2007 | Zhao et al. | |
| 2007/0090502 A1 | 4/2007 | Zhao et al. | |
| 2007/0108598 A1 | 5/2007 | Zhong et al. | |
| 2007/0200210 A1 | 8/2007 | Zhao et al. | |
| 2007/0267734 A1 | 11/2007 | Zhao et al. | |
| 2007/0267740 A1 | 11/2007 | Khan et al. | |
| 2007/0273023 A1 | 11/2007 | Zhao et al. | |
| 2007/0273049 A1 | 11/2007 | Khan et al. | |
| 2007/0278632 A1 | 12/2007 | Zhao et al. | |
| 2007/0290322 A1 | 12/2007 | Zhao et al. | |
| 2007/0290376 A1 | 12/2007 | Zhao et al. | |
| 2008/0006934 A1 | 1/2008 | Zhao et al. | |

OTHER PUBLICATIONS

Babinetz, Stephen, "Wire Bonding Solutions for 3-D Stacked Die Packages", Kulicke & Soffa Industries, as published in Electronics Manufacturing Engineering, Q3, 2003, pp. 1-10.

Carson et al. "Advances in Stacked-Die Packaging", ChipPAC Inc., 2002, pp. 7-13.

"TAPP™ Thin Array Plastic Package", ASAT Peak Performance, retrieved from the internet on Oct. 27, 2006, ttp://www.asat.com/products/leadless/tapp.php, pp. 1-5.

"ASAT's Fine-Pitch Ball Grid Array", ASAT Peak Performance, retrieved from the internet on Oct. 27, 2006, http://www.asat.com/index.php, pp. 1-2.

"Stacked Die", ASAT Peak Performance, retrieved from the internet on Oct. 27, 2006, http://www.asat.com/products/sip/stacked.phP, p. 1.

"PBGA Plastic Ball Grid Array", ASAT Peak Performance, retrieved from the internet on Oct. 27, 2006, http://www.asat.com/products/array/pbga.php, pp. 1-2.

Freyman et al., "Overmolded Plastic Pad Array Carriers (OMPAC): A low Cost, High Interconnect Density IC Packaging Solution for Consumer and Industrial Electronics", Electronic Components and Technology Conference, IEEE, 1991, pp. 176-182.

C.A. Happer, Electronic Packaging and Interconnection Handbook, 3rd Edition, McGraw-Hill, New York, pp. 7.61-7.67, 2000.

* cited by examiner

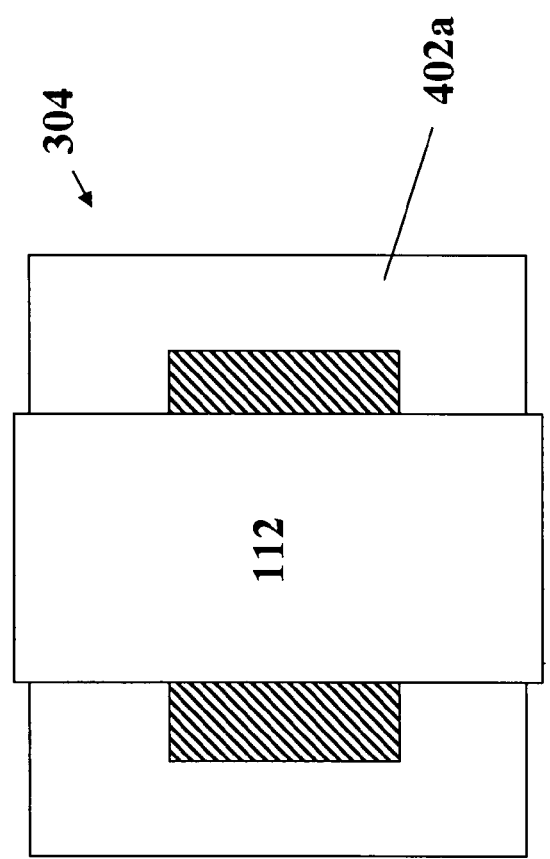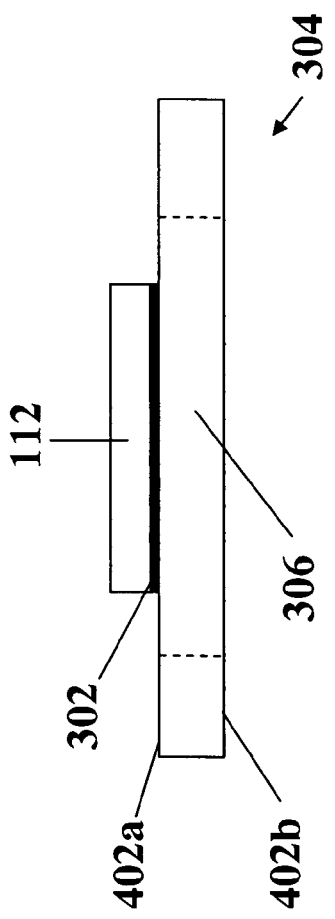

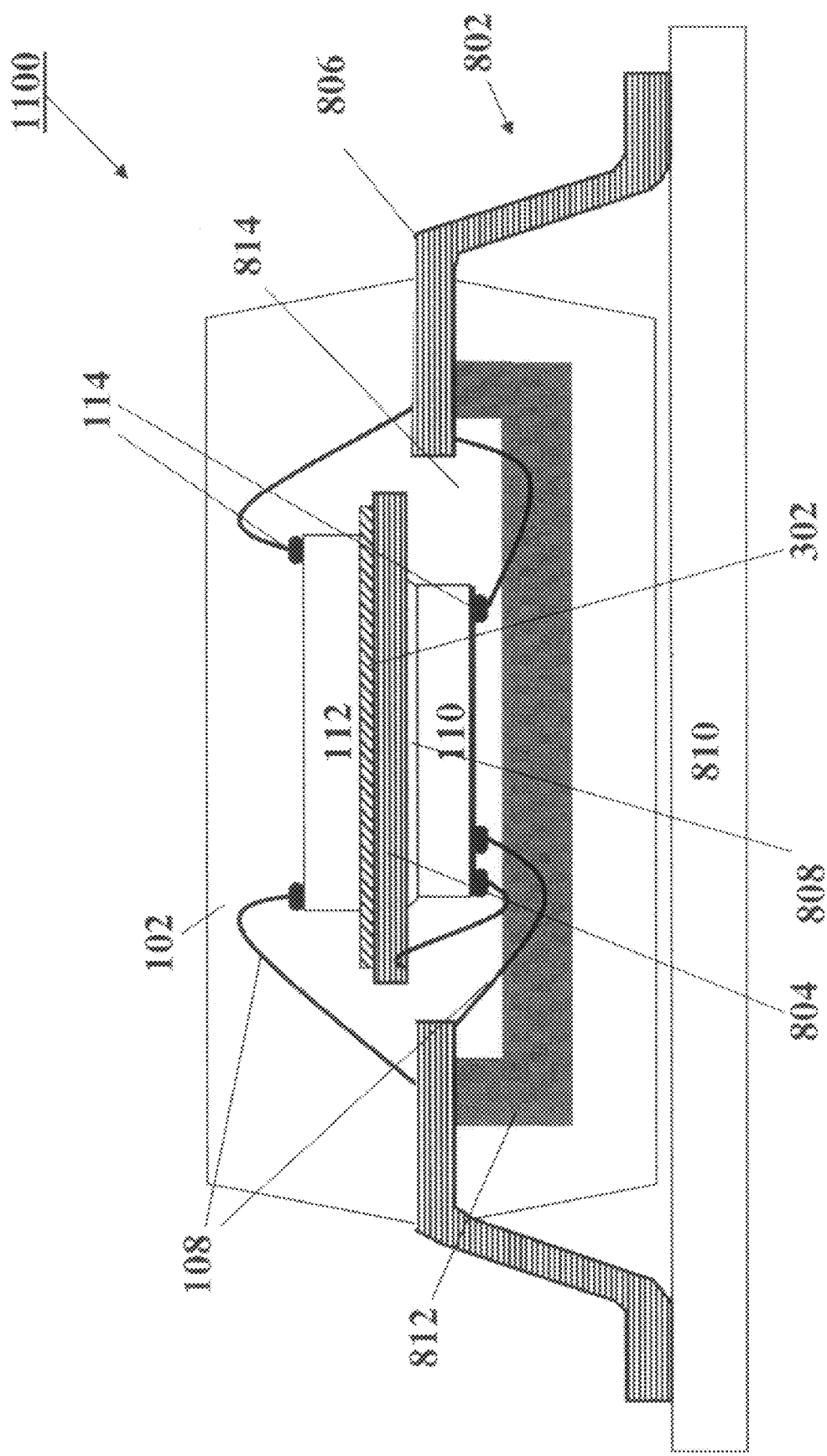

INTERPOSER FOR DIE STACKING IN SEMICONDUCTOR PACKAGES AND THE METHOD OF MAKING THE SAME

BACKGROUND OF THE INVENTION

1. Field of the Invention

The invention is in the field of integrated circuit (IC) device packaging technology. Specifically, the invention is related to stacked die packages.

2. Related Art

The die-up plastic ball grid array package was first introduced by Motorola and was called Overmolded Plastic Pad Array Carriers (OMPAC). For further detail on this package type, refer to "Overmolded Plastic Pad Array Carriers (OMPAC): A Low Cost, High Interconnect Density IC Packaging Solution for Consumer and Industrial Electronics," Electronic Components and Technology Conference, IEEE, pp. 176-182, 1991, which is incorporated by reference herein in its entirety. Commonly known as a "PBGA" package, the plastic ball grid array (PBGA) package features a plastic circuit board (substrate) typically made of Bismaleimide Triazine (BT) resins or FR4 materials.

Conventional BGA packages do not allow for the stacking of IC dies in a single package. Thus, what is needed is an IC package that allows for the stacking of IC dies.

SUMMARY OF THE INVENTION

Apparatuses, methods, and systems for improved integrated circuit packages are described. An IC package includes a first die coupled to a first surface of a substrate. An interposer is coupled to the first surface of the substrate. The interposer has an opening in a first surface configured to accommodate the first IC die. The first IC die resides in the opening. A second die is attached to a second surface the interposer. Wire bonds couple a plurality bond pads on a first surface of the first IC die and on a first surface of the second IC die to the plurality of bond fingers on the first surface of the substrate. An encapsulating material encapsulates the first IC die, the second IC die, the interposer, and the plurality of wire bonds.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE FIGURES

The accompanying drawings, which are incorporated herein and form a part of the specification, illustrate the embodiments of the present invention and, together with the description, further serve to explain the principles of the embodiments and to enable a person skilled in the pertinent art to make and use the invention.

FIGS. 4A and 4B show top and side views respectively of a ring interposer, according to an embodiment of the present invention.

FIGS. 10-11 show stacked leadframe packages, according to embodiments of the present invention.

Figure 1:
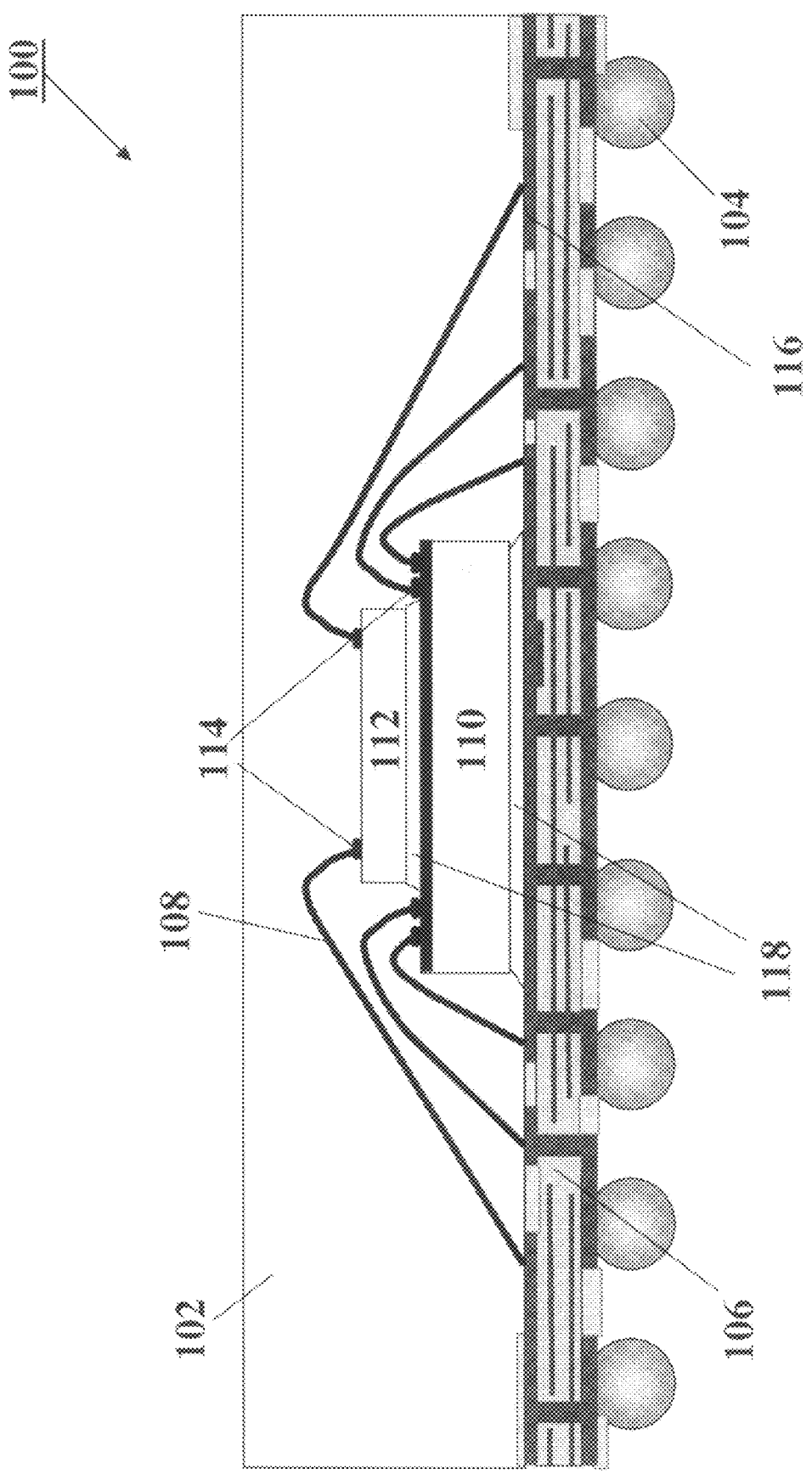
FIG. 1 shows a conventional stacked package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present specification discloses one or more embodiments that incorporate the features of the invention. The disclosed embodiments merely exemplify the invention. The scope of the invention is not limited to the disclosed embodiments. The invention is defined by the claims appended hereto.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Overview

The invention described herein provides improved stacked IC packages. The present invention is applicable to all types of substrates, including ceramic, plastic, and tape (flex) BGA packages.

Numerous embodiments of the present invention are presented herein. For example, in one embodiment, a stacked IC package with a first IC die and a second IC die is formed wherein an interposer is used to support the second die in a die stack. The second IC die is mounted on a first surface of the interposer. The interposer is attached to a first surface of a substrate and has an opening in a central region of a second surface of the interposer. The first die is attached to the first surface of the substrate within the opening in the interposer. Wire bonds provide interconnection between the first die and the second die and the substrate. Both the first IC die and the associated wire bonds are within an envelope of the interposer opening. The first surface of the interposer is substantially planar on which the second die is attached.

The opening can be through the interposer such that the interposer is in a ring shape. Alternatively, the opening may also be a cavity that does not extend through interposer, such that the first IC die is not accessible from the first surface. The size and shape of the opening may be different at different points in the interposer.

Integrated Circuit Technology

An IC package traditionally contains a single semiconductor die. Multiple dies are used in IC packages by either laying them side-by-side or stacking one on top of another. Die Stacking is the process of mounting multiple dies on top of each other within a single semiconductor package. Some advantages of die stacking include saving space within IC packages, reducing the real estate requirement of the IC package on a circuit board, enabling system-in-package (SiP) applications, and improving device electrical performance due to shorter interconnections between circuits.

When dies are stacked, wire bonds are commonly used both for die-to-die interconnection and interconnection between a die and the package substrate. As the number of stacked dies increases, wire loop length increases and controlling wire loop shape becomes more complicated. Moreover, as the number of stacked dies increases, the total height of the die stack may become too high to be packaged according to industry standards. Advancements in wafer thinning technology have reduced die thickness to three to four mils and enabled four-die and five-die stacking in a single industry standard package. For more information, refer to "Wire Bonding Solutions for 3-D Stacked Die Packages," Electronics Manufacturing Engineering, 2003, by Babinetz, which is incorporated herein in its entirety.

The die attach process is critical to stacked-die packages. The die attach must be thin and have tight tolerance in order for the die stack to fit within the mold cap. In addition, which die configurations can be stacked are dependent on the die attach process and controlling the fillet. The nominal bond line thickness of the die attach material must be chosen to allow for highest reliability without damaging the active circuit surface of the lower die in the die stack. For more information refer to "Advances in Stacked-Die Packaging," Proceedings NEPCON West Conference, 2002, by Carson and Karnezos, which is incorporated herein in its entirety.

A common die stacking package 100 is shown in FIG. 1. Package 100 includes a first (bottom) IC die 110, a second (top) IC die 112, an encapsulating material 102, bond pads 114, wire bonds 108, a substrate 106, bond fingers 116, an adhesive 118, and a plurality of solder balls 104. Wire bonds 108 couple bond pads 114 on first die 110 and second die 112 to bond fingers 116 on a first surface of substrate 106. Encapsulating material 102 encapsulates first die 110, second die 112, wire bonds 108, bond fingers 116, and bond pads 114. Solder balls 104 are coupled to solder ball pads on a second surface of substrate 106. In alternate embodiments, conductive pins may be used instead of solder balls to form a pin grid array (PGA) package. Second IC die 112 is stacked on first IC die 110. Second IC die 112 is mounted inside the periphery of a first (top) surface of first die 110. Thus, second die 112 must be smaller than first die 110 in both linear dimensions when package 100 is used to stack dies.

In some cases, however, the first and second dies may be substantially similar in size. For example, the first and second dies in high speed ASIC or memory, such as DDR2, DDR3, or DDR4 (double data rate memory blocks), may be substantially similar in size.

Figure 2:
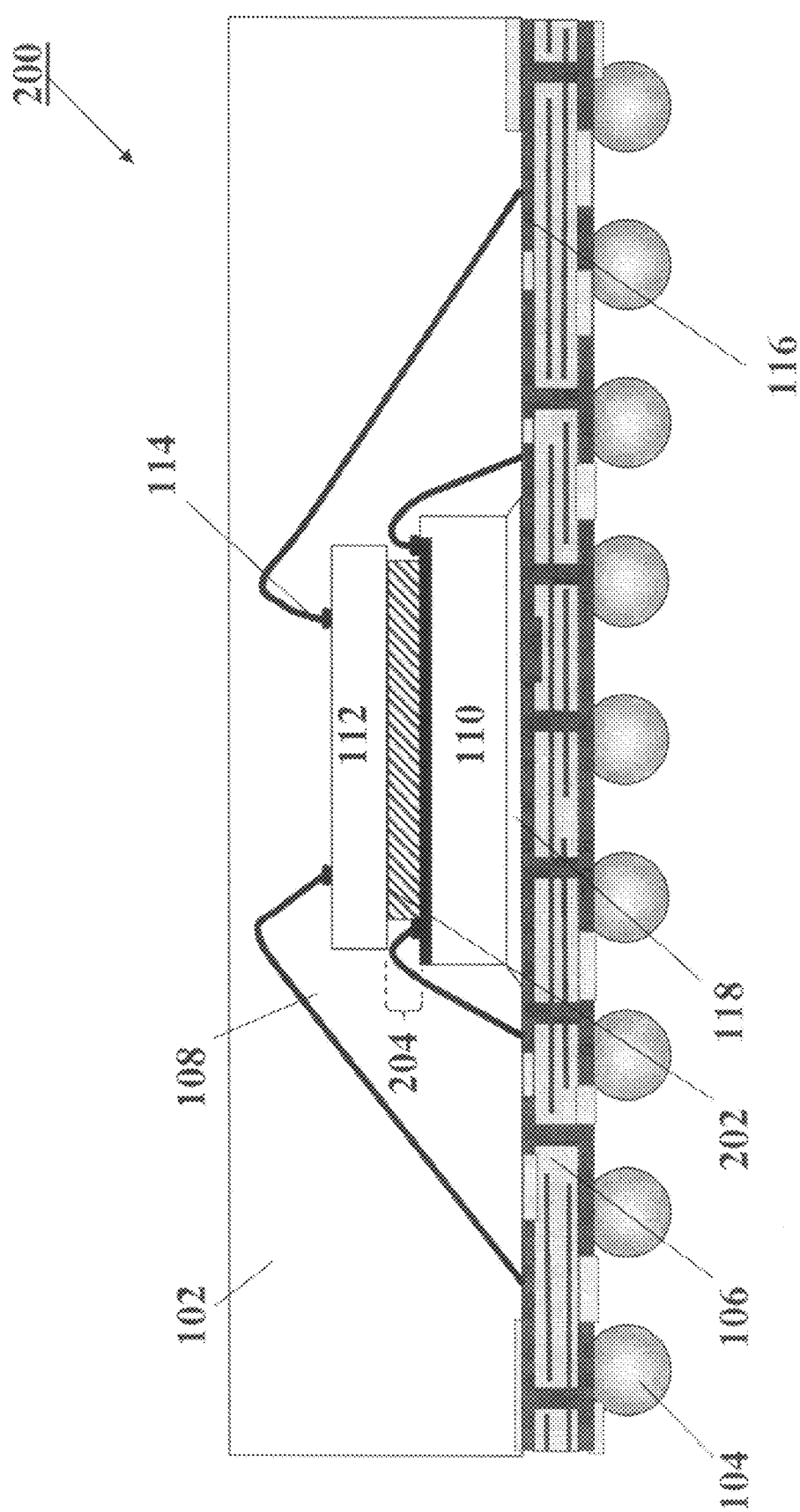
FIG. 2 shows another conventional stacked package when the IC die are similar in size.

FIG. 2 shows a package 200 which may be used when the first and second die are similar in size or if the second die is larger than the first die. Package 200 is generally similar to package 100 shown in FIG. 1, however it also includes a silicon spacer 202 that increases a distance 204 between first die 110 and second die 112. First die 110 and second die 112 are similar in at least one linear dimension. While package 200 allows for the stacking of die that are similar in a linear dimension, the use of spacers between first die 110 and second die 112 adds to a total thickness of package 200. In addition, since silicon spacer 202 must be smaller than both first die 110 and second die 112, an overhang of second die 112 can be very large when first die 110 is smaller than second die 112.

With a reduction of die thickness, the overhang allowed between second die 112 and silicon spacer 202 is reduced. Since bond pads 114 are located along the edge of second die 112 in an overhang region, the overhang can act as a springboard under the application of force during wire bonding. A large overhang of second die 112 can introduce large stresses on both second die 112 and an interface between second die 112 and spacer 202. The forces applied to the overhang edges of second die 112 during a wire bonding process may crack second die 112 and/or cause breakage. Other problems such as inconsistency of a loop profile, degradation of wire bonds on pad, and loss of wire (short tail) can also occur due to the flexing and/or vibration of overhang during a wire bond process.

EMBODIMENTS OF THE INVENTION

Further details of structural and operational implementations of stacked packages of the present invention are described in the following sections. These structural and operational implementations are described herein for illustrative purposes, and are not limiting. For instance, the present invention as described herein may be implemented in other IC package types, including land grid array (LGA), pin grid array (PGA), leadframe packages, and fine pitch ball grid array (FBGA) packages, including any of the packages described above. Furthermore, each of the embodiments presented below are applicable to flex tape substrate packages, plastic substrate packages, ceramic substrate packages, and other substrate types. The description below is adaptable to these and other package types, as would be understood to persons skilled in the relevant art(s) from the teachings herein.

Features of each of the embodiments presented below may be incorporated into stacked packages independently, or may be combined in any manner with the other features described herein, as would be apparent to persons skilled in the relevant art(s) from the teachings herein.

Figure 3:
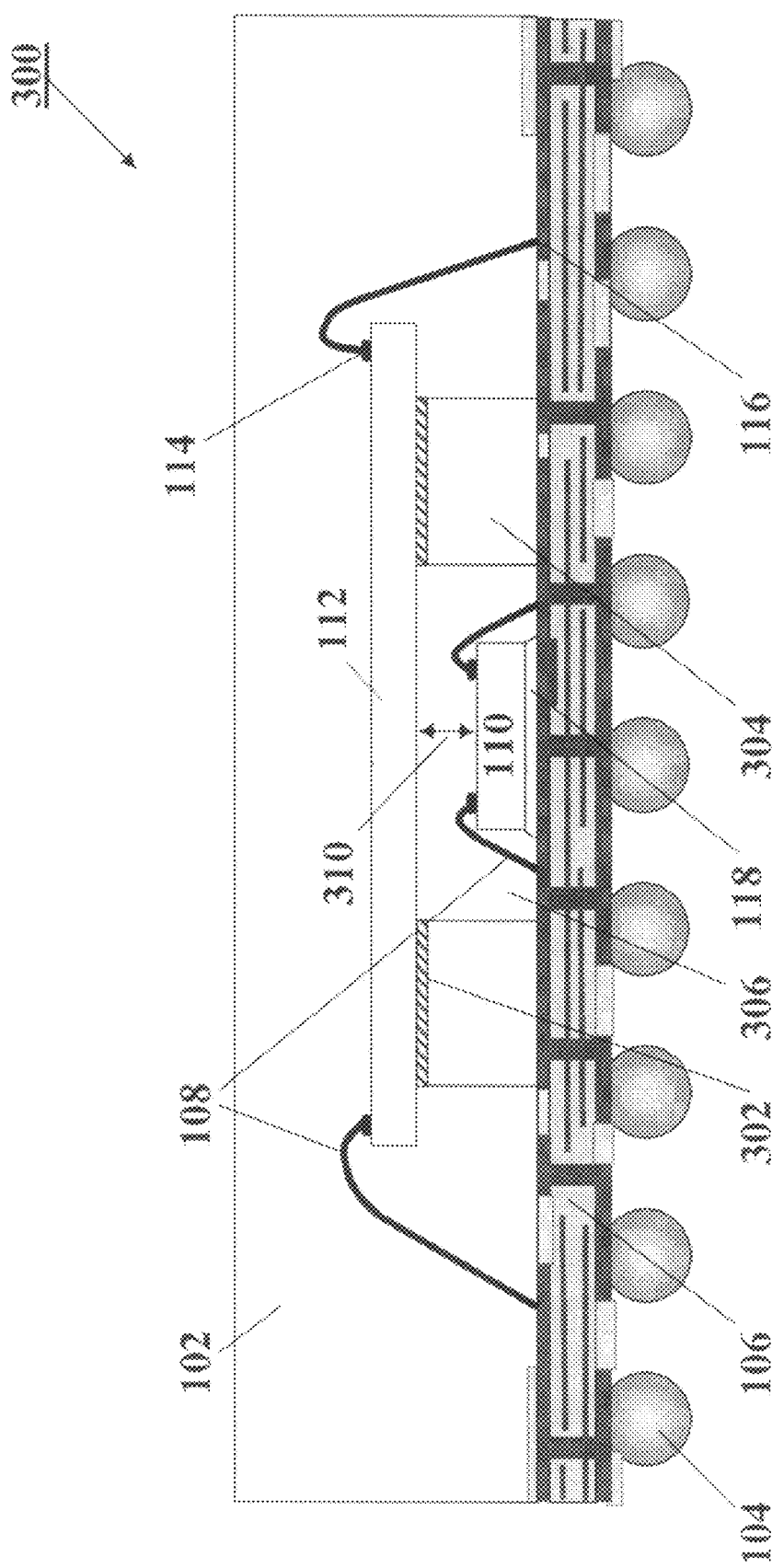
FIG. 3 shows a stacked package using a ring interposer, according to an embodiment of the present invention.

FIG. 3 shows a cross-sectional view of a stacked package 300, according to an embodiment of the present invention. Package 300 includes first (bottom) IC die 110, second (top) IC die 112, encapsulating material 102, bond pads 114, wire bonds 108, substrate 106, solder balls 104, an adhesive 302, and an interposer 304.

Substrate 106 can be organic (BT, FR4, etc.), ceramic, glass, tape, and/or made from other dielectric materials. Furthermore, substrate 106 may have one or more conductive layers, including features such as contact pads, bond fingers, traces, conductive planes, etc., for transmission of electrical signals, attachment of wire bonds, solder balls, etc., to enhance mounting of electrical components, for power/ground planes, etc. Vias or other electrically conductive regions may be used to electrically couple conductive regions through substrate 106.

According to one embodiment of the present invention, first IC die 110 is mounted within an opening 306 in interposer 304. Interposer 304 is shown in FIG. 3 as having a ring shape such that first die 110 is accessible from a top surface of interposer 304. A distance 310 between first die 110 and second die 112 is configured to accommodate the first die 110 and all associated wire bonds 108. Opening 306 remains the same size and shape throughout interposer 304. In alternate embodiments, however, the size and shape of opening 306 may change at different points in interposer 304.

Second die 112 is larger in at least one linear dimension than the corresponding linear dimension of opening 306 in the top surface of interposer 304. FIG. 3 shows second die 112 as being larger than opening 306 in a first linear dimension (e.g. width). However, second die 112 may be larger in another linear dimension or multiple linear dimensions as would be understood by persons skilled in the relevant art(s). Second die 112 is attached to the top of interposer 304 through adhesive 302. Wire bonds 108 couple bond pads 114 on the first surface of second IC die 112 to bond fingers 116 on the first surface of substrate 106. Second die 112 is substantially larger than first die 110. To reduce the loop height of wire bonds coming from first die 110 and reduce package overall thickness, reverse wire bonds on die I/O pads can be used.

Interposer 304 is made of organic materials such as polymers, including polyimide film, BT, and FR4. Inorganic materials such as silicon, ceramics, glass, and metals can also be used. When thermally conductive inorganic materials are used, interposer 304 becomes a heat spreader for second die 112 that improves the package thermal performance. Thermally conductive materials may include copper, copper alloys, aluminum, and/or stainless steel.

FIGS. 4A and 4B show top and side views, respectively, of ring shaped interposer 304 and second die 112. FIG. 4A shows second IC die 112 coupled to a first (top) surface 402a of interposer 304. As shown in FIG. 4A, die 112 is larger than opening 306 in one linear dimension. In other embodiments, IC die 112 is larger than opening 306 in both linear dimensions. FIG. 4B shows that opening 306 extends vertically through the entire interposer 304 with an opening in first surface 402a of interposer 304 being identical to an opening in the second (bottom) 402b of interposer 304. In alternate embodiments, the size and shape of opening 306 may change throughout interposer 304. Opening 306 is configured to accommodate both first IC die 110 and all associated wire bonds 114 (not shown).

Figure 5:
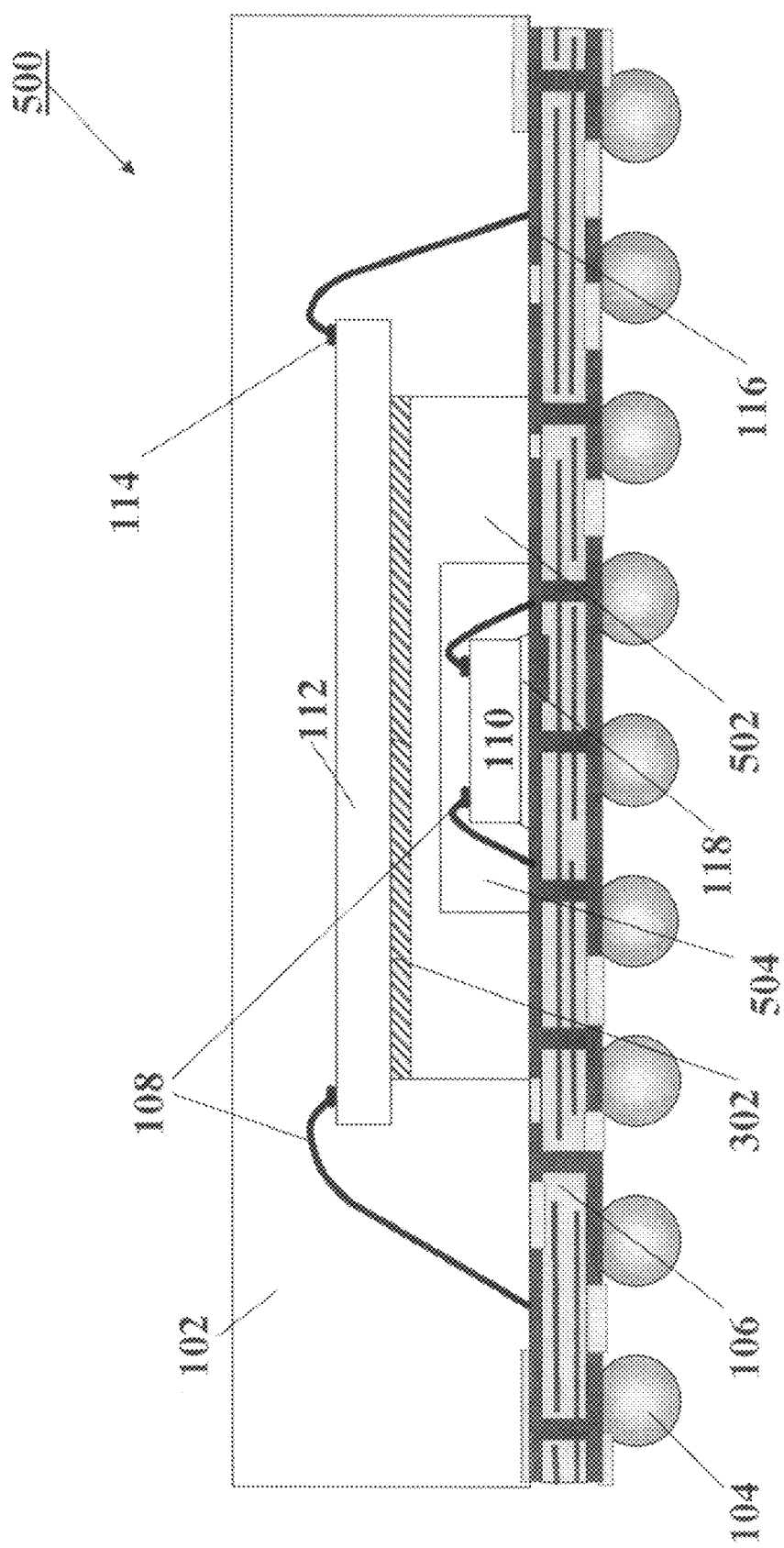
FIG. 5 shows a stacked package using a cavity-shaped interposer, according to an embodiment of the present invention.

FIG. 5 shows a package 500, according to another embodiment of the present invention. Package 500 is substantially similar to package 300 shown in FIG. 3. However, package 500 includes a cavity shaped interposer 502 with a corresponding cavity 504 instead of ring shaped interposer 304.

Interposer 502 has a cavity shape in which cavity 504 does not extend through interposer 502 as is the case in interposer 304 shown in package 300. Cavity shaped interposer 502 may be cup shaped so that interior surfaces are curved rather than straight. Second IC die 112 is mounted on a first (top) surface of interposer 502 and attached using adhesive 302. Wire bonds 108 couple bond pads 114 on the top surface of second IC die 112 to bond fingers 116 on the top surface of substrate 102.

Cavity 504 is configured to accommodate both first IC die 110 and all associated wire bonds 108. To reduce a loop height of wire bond connections 108 of first die 110 and to reduce package overall thickness, reverse wire bonds on die I/O pads can be used.

FIGS. 3 and 5 discussed above both show two IC dies being stacked. In alternate embodiments, three or more dies may be stacked. Moreover, FIGS. 3 and 5 show stacked packages with solder balls that may be used to couple the packages to a circuit board. In alternate embodiments, however, other means may be used to couple the packages to a circuit board, such as electrically conductive pins.

Figure 6A:
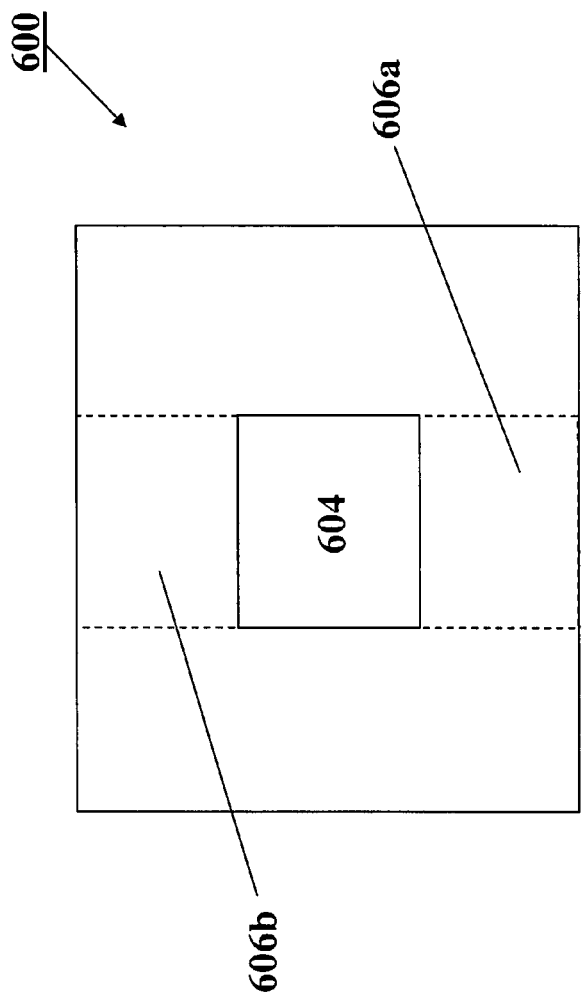
FIGS. 6A-6I show different channels that may be formed in interposers, according to embodiments of the present invention.
Figure 6B:
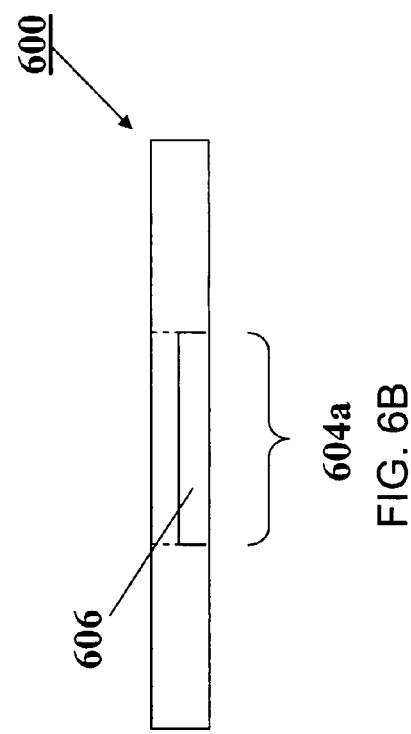

FIGS. 6A-6F show ring shaped interposers, according to embodiments of the present invention. FIGS. 6A and 6B show top and side views, respectively, of a ring shaped interposer 600 according to an embodiment of the present invention. Interposer 600 includes an opening 604 and channels 606a and 606b. As shown in FIG. 6B, opening 604 remains the same size throughout interposer 600. Opening 604 is configured to accommodate an IC die.

As shown in FIGS. 6A and 6B, channels 606a and 606b are openings that lead to opening 604. Channels 606a and 606b may be used to assist in an assembly process by facilitating encapsulation material flow into opening 604. As shown in FIGS. 6A and 6B, channels 606a and 606b share a linear dimension (e.g. a width) with opening 604.

Figure 6C:
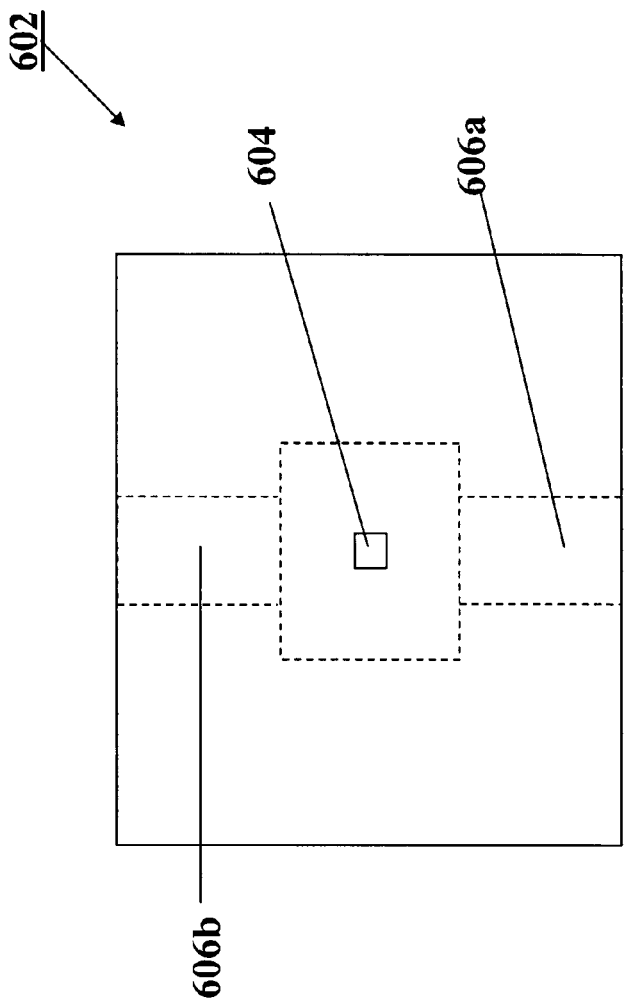
Figure 6D:
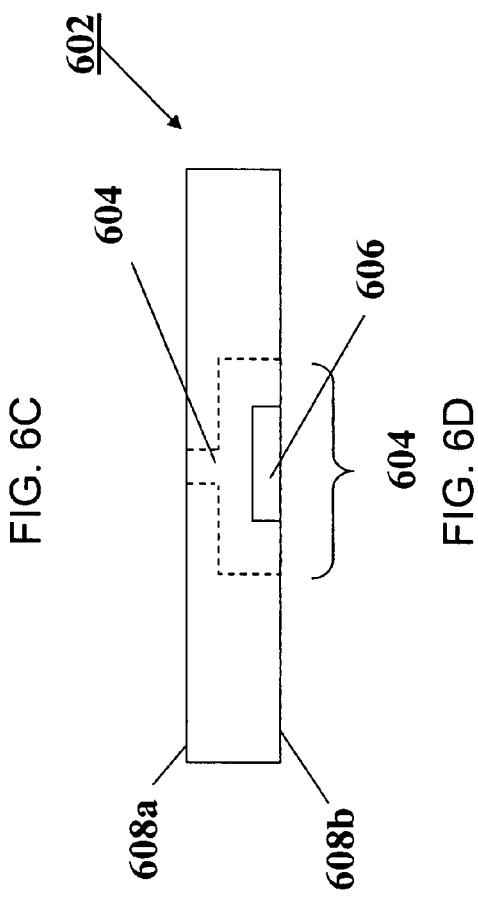

FIGS. 6C and 6D show top and side views, respectively, of a ring shaped interposer 602, according to another embodiment of the present invention. Interposer 602 is substantially similar to interposer 600 shown in FIGS. 6A and 6B. However, the size of opening 604 changes at different points in interposer 602. In particular, opening 604 is smaller at a first (top) surface 608a than at a second (bottom) surface 608b. Also shown in FIGS. 6C and 6D, channels 606a and 606b are smaller in the linear dimension (e.g. width) than a portion of opening 604 that overlaps channels 606a and 606b.

Figure 6E:
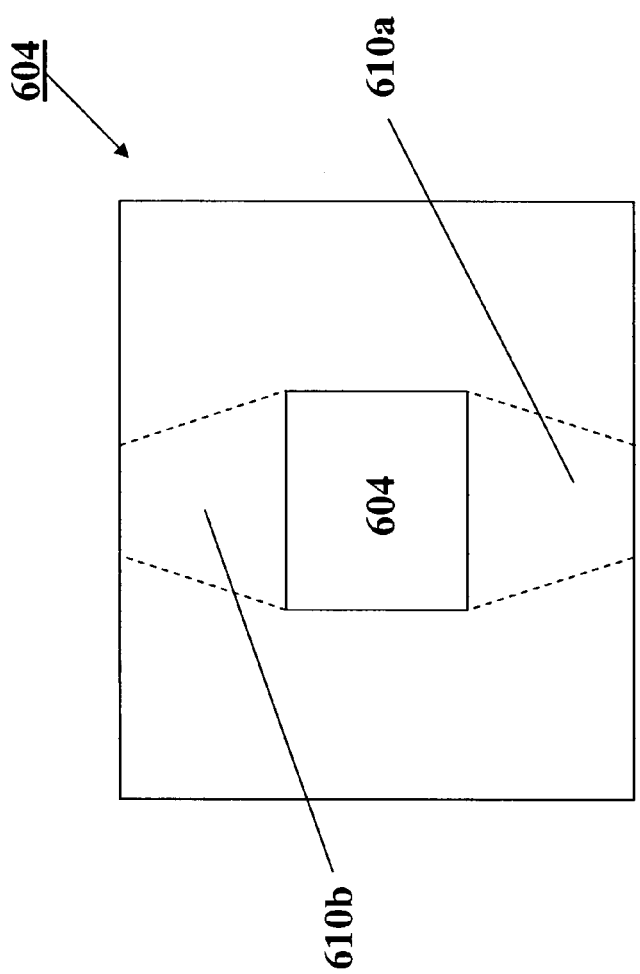
Figure 6F:
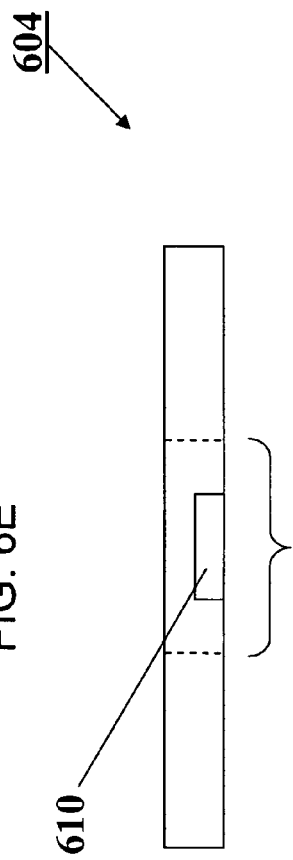

FIGS. 6E and 6F show top and side views of a ring shaped interposer 604, according to another embodiment of the present invention. Interposer 604 is substantially similar to interposer 600 shown in FIGS. 6A and 6B. However, as shown in FIG. 6E interposer 604 has channels 610a and 610b that have walls that expand in the first linear dimension (e.g. width) as channels 610a and 610b reach opening 604. The walls of channels 610a and 610b are shown in FIG. 6E to expand substantially linearly and gradually. In alternate embodiments, however, the walls may have curved expansion and/or step expansion.

Figure 6G:
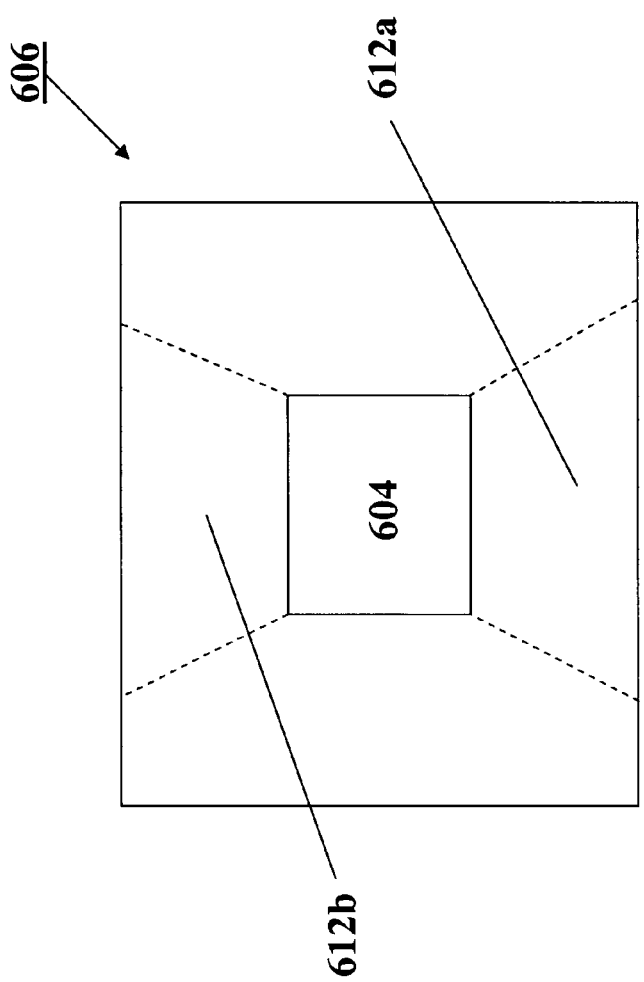
Figure 6H:
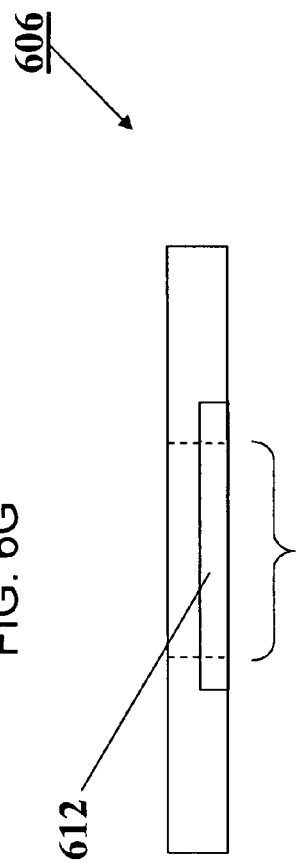

FIGS. 6G and 6H show top and side views, respectively, of a ring shaped interposer 606, according to a further embodiment of the present invention. In interposer 606, walls of channels 612a and 612b expand as they approach an outer edge of interposer 606. The walls of channels 612a and 612b are shown in FIG. 6G to expand substantially linearly and gradually. In alternate embodiments, however, the walls may have curved expansion and/or step expansion.

Figure 6I:
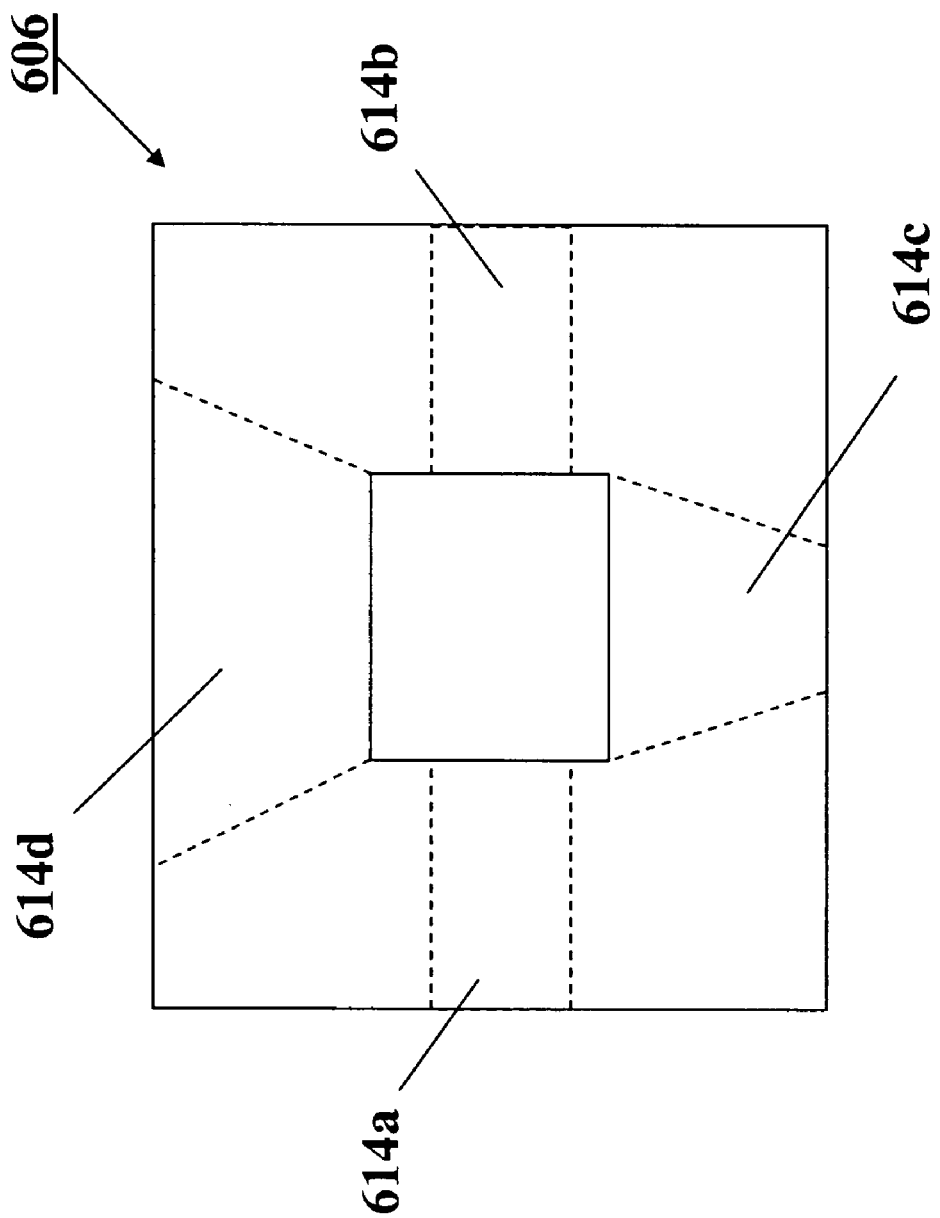

FIG. 6I shows a ring shaped interposer 608, according to a further embodiment of the present invention. Interposer 608 has four channels 614a-614d. Channels 614a and 614b are shown to keep the same linear dimension (length) throughout. Channels 614c and 614d are shown to become larger and smaller, respectively, along the linear dimension as each channel approaches opening 604. In other embodiments, interposer 608 may have any number channels with different shapes.

Although the example interposers shown in FIGS. 6A-6J are shown to be ring shaped interposers, the embodiments discussed therein may also be applied to cavity shaped interposers, as would be understood by persons skilled in the relevant art(s). Moreover, opening 604 is shown to be substantially rectangular. In alternate embodiments, opening 604 may be elliptical, triangular, etc.

Figure 7:
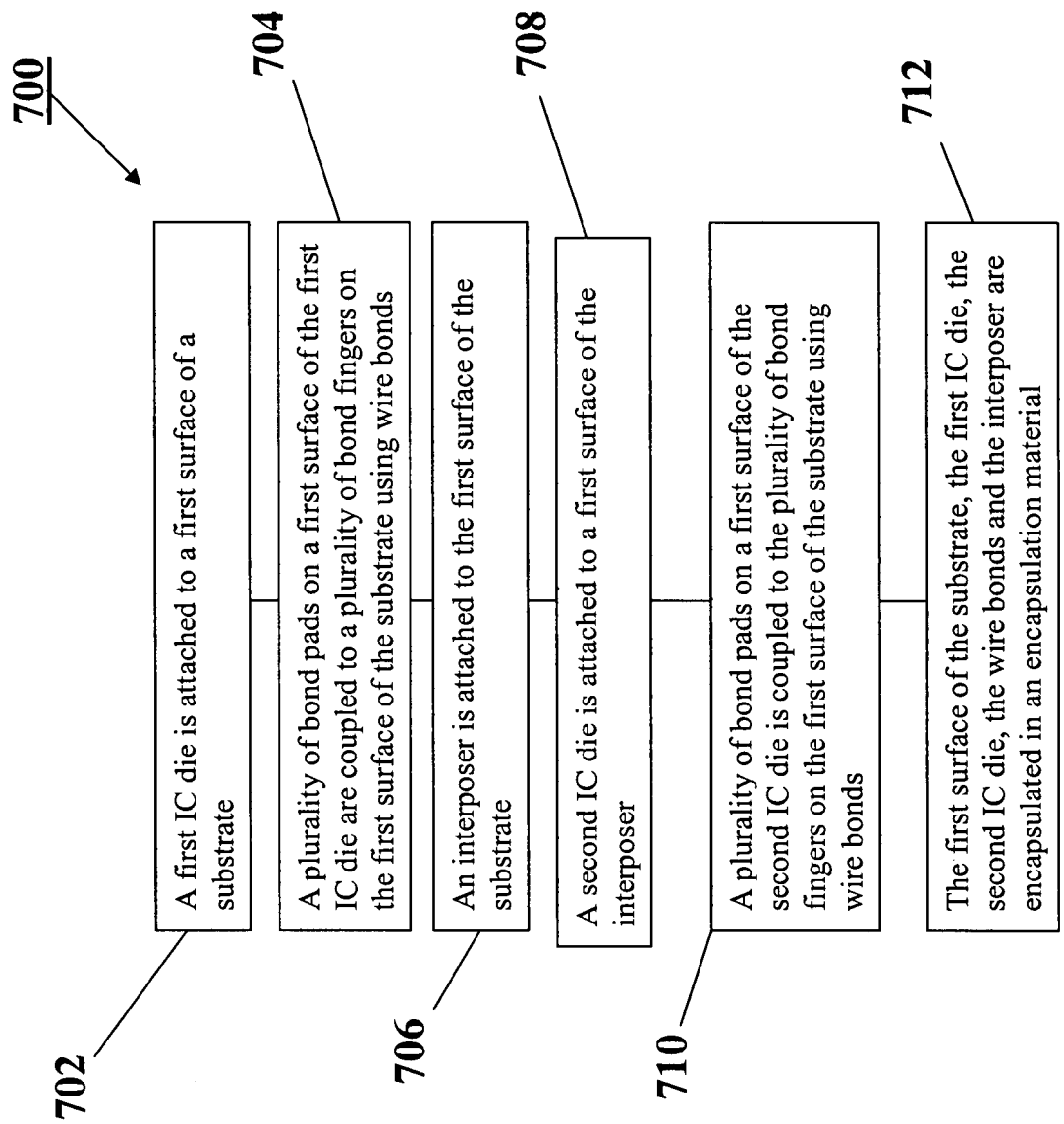
FIG. 7 shows a flowchart providing example steps for assembling a stacked package, according to an embodiment of the present invention.

FIG. 7 shows a flowchart 700 providing example steps for assembling stacked IC packages. Other structural and operational embodiments will be apparent to persons skilled in the relevant art(s) based on the following discussion. The steps shown in FIG. 7 do not necessarily have to occur in the order shown. The steps of FIG. 7 are described in detail below.

Flowchart 700 begins in step 702. In step 702, a first IC die is attached to a first surface of a substrate. The first die may be attached using an adhesive or epoxy. For example, in FIG. 3, first die 110 is attached to substrate 106 through adhesive 118.

In step 704, a plurality of bond pads on a first surface of the first IC die are coupled to a plurality of bond fingers on the first surface of the substrate using wire bonds. For example, in FIG. 3, bond pads 114 of first die 110 are coupled to bond fingers 116 using wire bonds 108.

In step 706, an interposer is attached to the first surface of the substrate. The interposer has an opening configured to accommodate the first IC die. The first IC die resides in the opening. For example, in FIG. 3, interposer 304 is attached to the first surface of substrate 106 such that first IC die 110 is located within opening 306.

In step 708, a second IC die is attached to a first surface of the interposer. The second die may be attached using an adhesive or an epoxy. For example, in FIG. 3, second IC die 112 is attached to a first surface of interposer 304 using adhesive 302. In the case of a ring shaped interposer, the second die may be larger than an opening in a top of the interposer in at least one linear dimension to facilitate mounting.

In step 710, a plurality of bond pads on a first surface of the second IC die is coupled to the plurality of bond fingers on the first surface of the substrate using wire bonds. For example, in FIG. 3, bond pads 114 of second die 112 are coupled to bond fingers 116 using wire bonds 108.

In step 712, the first IC die, the second IC die, the wire bonds and the interposer are encapsulated in an encapsulation material. For example, in FIG. 3, first die 110, second die 112, wire bonds 108, and interposer 304 are encapsulated in encapsulating material 102.

Although the steps provided in flowchart 700 are illustrated using a ring shaped interposer, the steps may also be applied equally well in assembling a package with a cavity shaped interposer.

As noted above, the steps of flow chart 700 need not be performed in the order listed above. In particular, steps 704 and 706 may be reversed when the assembly process includes a ring shaped interposer.

Moreover, the steps of flowchart 700 may also be extended to stack 3 three or more die in a single package.

Figure 8:
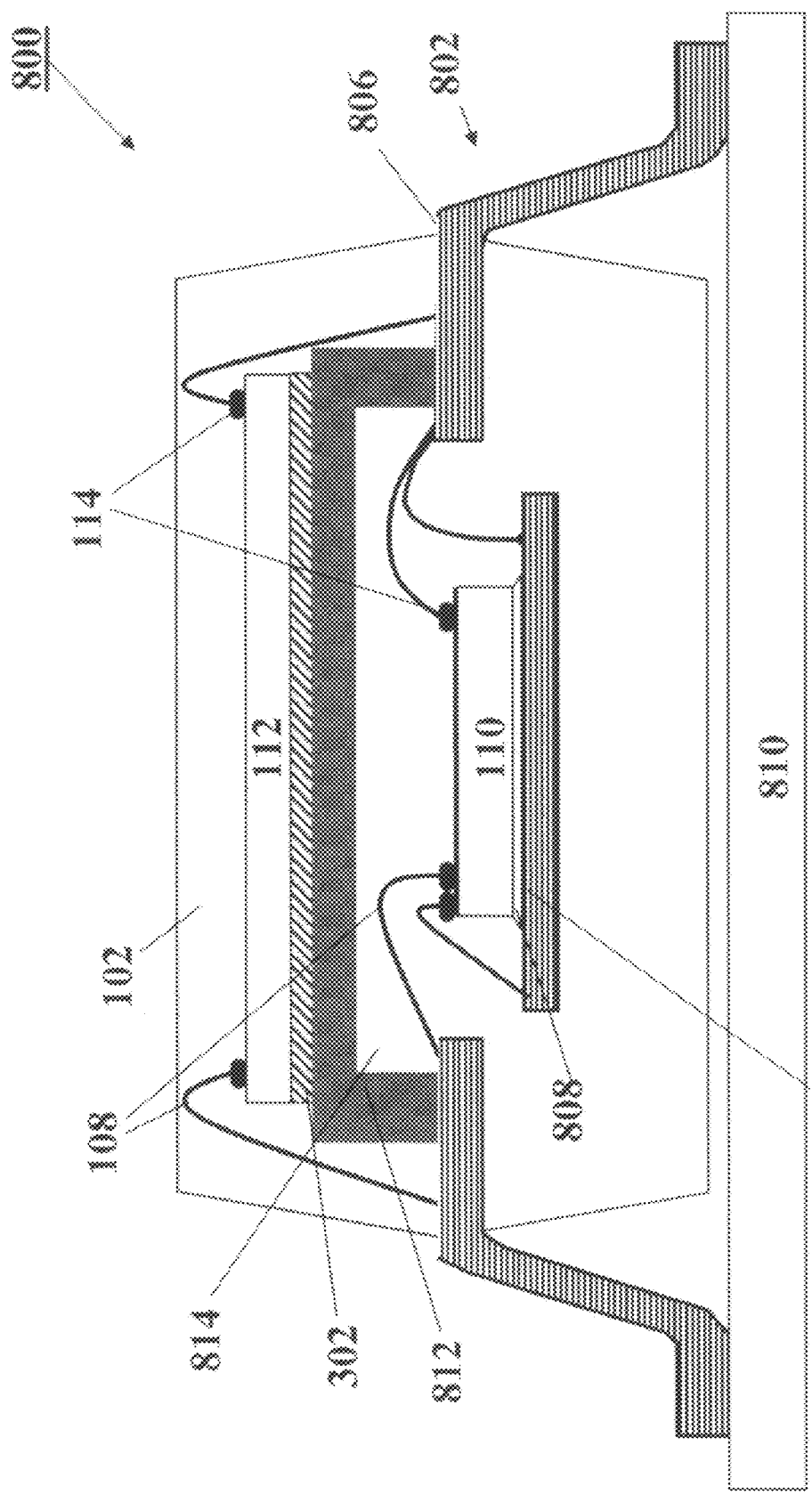
FIG. 8 shows a stacked leadframe package, according to an embodiment of the present invention.

FIG. 8 shows a stacked leadframe package 800. Package 800 includes first IC die 110, second IC die 112, encapsulation material 102, bond pads 114, wire bonds 108, a cavity shaped interposer 812, a circuit board 810 and a leadframe 802. Cavity shaped interposer 812 is substantially similar to cavity shaped interposer 502 except that interposer 812 is configured to be mounted to a first (top) surface of leadframe 802. Interposer 812 has an opening 814 configured to accommodate first IC die 110. Leadframe 802 includes a centrally located die attach pad 804 and a plurality of leads 806. Although FIG. 8 shows a stacked leadframe package formed with cavity shaped interposer 812, a ring shaped interposer, such as ring shaped interposer 304 shown in FIG. 3, may also be used to form the stacked leadframe package.

Figure 9:
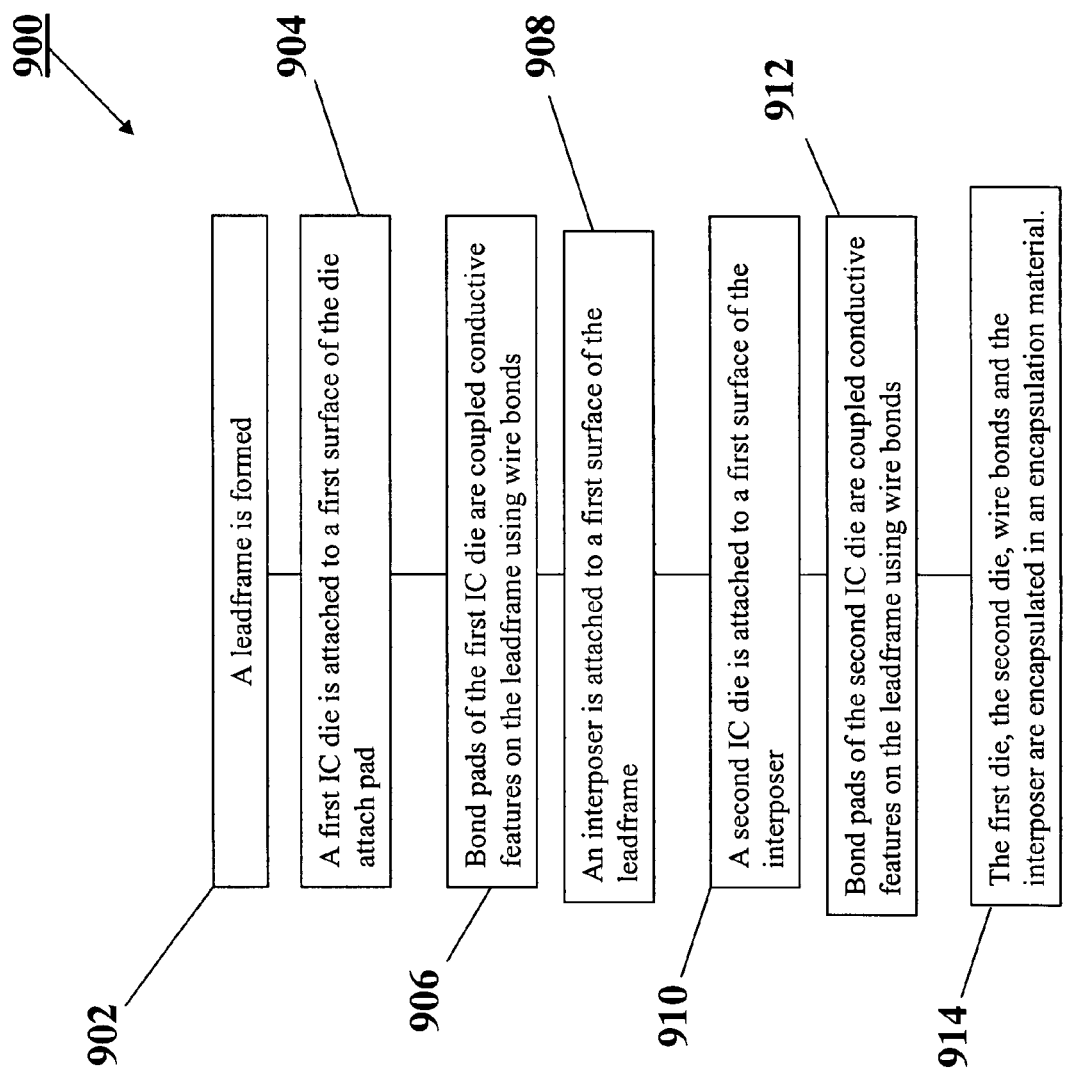
FIG. 9 shows a flowchart providing example steps for assembling a stacked leadframe package, according to an embodiment of the present invention.

FIG. 9 shows a flowchart 900 providing example steps for assembling stacked leadframe IC packages. Other structural and operational embodiments will be apparent to persons skilled in the relevant art(s) based on the following discussion. The steps shown in FIG. 9 do not necessarily have to occur in the order shown. The steps of FIG. 9 are described in detail below.

Flowchart 900 begins with step 902. In step 902, a leadframe is formed. The leadframe includes a centrally located die attach pad and a plurality of leads. For example, in FIG. 8, leadframe 802 is formed with a centrally located die attach pad 804 and plurality of leads 806.

In step 904, a first IC die is attached to a first surface of the die attach pad. The first IC die may be attached to the first surface of the die attach pad using an adhesive. The die attach pad is not necessarily coplanar with the plurality of leads. For example, in FIG. 8, first IC die 110 is attached a first (top) surface of die attach pad 804 through an adhesive 808. As shown in FIG. 8, die attach pad 804 is not coplanar with plurality of leads 806.

In step 906, bond pads of the first IC die are coupled to conductive regions on the leadframe using wire bonds. The conductive regions on the leadframe may be plated with an electrically conductive material, such as gold or silver, to facilitate wire bond attachment. For example, in FIG. 8, wire bonds 108 couple bond pads 114 to conductive regions on leadframe 802.

In step 908, an interposer is attached to a first surface of the leadframe. The interposer has an opening configured to accommodate the first IC die attached to the die attach pad and all associated wire bonds. The first IC die is located within the opening. For example, in FIG. 8, interposer 812 is attached to a first surface of leadframe 802 such that IC die 110 is located within opening 814.

In step 910, a second IC die is attached to a first surface of the interposer. The second IC die may be attached to the interposer using an adhesive. For example, in FIG. 8, second IC die 112 is attached to a first surface of interposer 812 through adhesive 302.

In step 912, bond pads of the second IC die are coupled to conductive regions on the leadframe using wire bonds. For example, in FIG. 8, wire bonds 108 couple bond pads 114 of second die 112 to conductive regions on leadframe 802.

In step 914, the first die, the second die, wire bonds and the interposer are encapsulated in an encapsulation material. For example, in FIG. 8, first die 110, second die 112, wire bonds 108 and interposer 812 are encapsulated in encapsulation material 102.

Although the steps provided in flowchart 900 are illustrated using a cavity shaped interposer, the steps may also be applied equally well in assembling a package with a ring shaped interposer.

Figure 10:
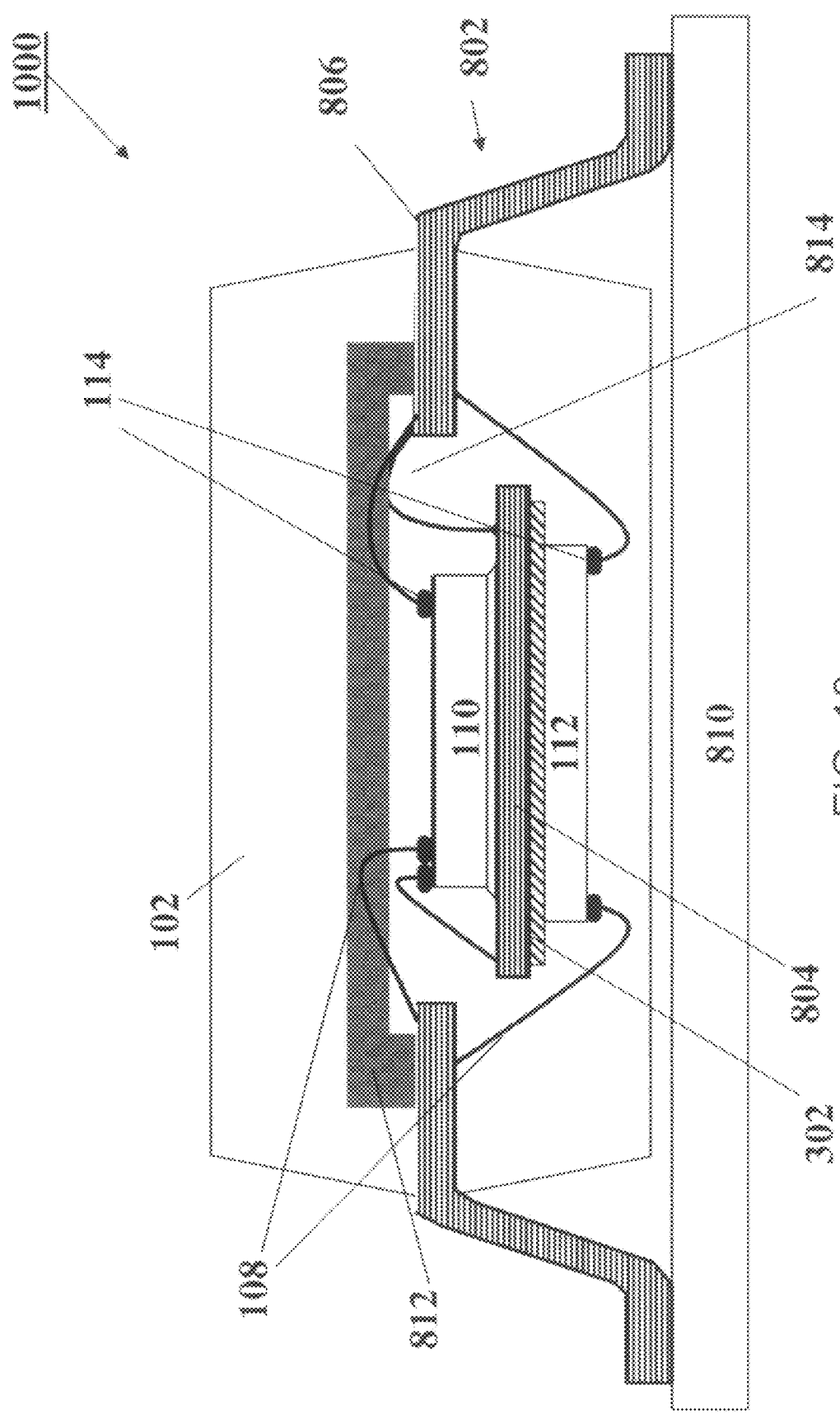

FIG. 10 shows stacked IC leadframe package 1000, according to another embodiment of the present invention. Package 1000 is substantially similar to package 800 except that second die 112 is attached to a second (bottom) surface of die attach pad 804 using adhesive 808. Wire bonds 108 couple bond pads 114 on the top and bottom surfaces of die 110 and 112, respectively, to leadframe 802. As shown in FIG. 10, package 1000 also includes cavity shaped interposer 812 which has a portion of wire bonds 108 coming from the first IC die 110 embedded within. Interposer 812 may protect die 110 and wire bonds 108 coming from first die 110 when IC die 112 is attached to the bottom surface of die attach pad 804. If a ring shaped interposer is used instead of a cavity shaped interposer, a removable tape may be coupled to a first surface (top) of the ring shaped interposer to protect die 110 and all associated wire bonds 108 during die attachment of second die 112 and an associated wire bonding process.

FIG. 11 shows essentially the same embodiment in package 1100 wherein die 110, die 112, die attach pad 804, and interposer 812 are mirrored across the plane including leadframe 802.

Example Advantages

Embodiments of the present invention provide many advantages over conventional stacked packages, including those described above with respect to FIGS. 1 and 2. Some of these advantages are described below. Each advantage described below does not necessarily apply to each embodiment described herein. Furthermore, the advantages provided by embodiments of the present invention are not necessarily limited to those described below.

(1) Prevents breakage in a top IC die as is possible when a package similar to package 200 is used to stack two or more dies.

(2) Allows for the stacking of a substantially larger die on a smaller die.

(3) Creates a heat spreader for the second die to provide on-chip cooling of a hot spot.

CONCLUSION

While various embodiments of the present invention have been described above, it should be understood that they have been presented by way of example only, and not limitation. It should be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

What is claimed is:

1. An integrated circuit (IC) device package, comprising:
    a substrate having opposing first and second surfaces;
    a first IC die having opposing first and second surfaces, wherein the first IC die is coupled to the first surface of the substrate;
    an interposer, having opposing first and second surfaces, coupled to the first surface of the substrate, the interposer having an opening in the first surface of the interposer configured to accommodate the first IC die, wherein the interposer has a plurality of channels formed in the first surface and extending from the opening to an outer edge of the interposer and wherein the walls of the channels taper;
    a second IC die having opposing first and second surfaces, wherein the second IC die is coupled to the second surface of the interposer;
    a first wire bond that couples a bond pad on the first surface of the first IC die to a bond finger on the first surface of the substrate;
    a second wire bond that couples a bond pad on the first surface of the second IC die to a bond finger on the first surface of the substrate; and
    an encapsulation material, encapsulating the first IC die, the second IC die, the interposer and the wire bonds.

2. The package of claim 1, wherein the opening in the interposer extends through the interposer to the second surface of the interposer such that the first IC die is accessible from both the first and second surfaces of the interposer.

3. The package of claim 1, further comprising contact pads on the second surface of the substrate that are electrically coupled through the substrate to bond fingers on the first surface of the substrate.

4. The package of claim 3, wherein the contact pads are solder ball pads and solder balls are formed on the solder ball pads.

5. The package of claim 3, further comprising a plurality of conductive pins attached the contact pads on the second surface of the substrate.

6. The package of claim 1, wherein the walls of the channels taper inward as the channels approach the outer edge.

7. The package of claim 1, wherein the walls of the channels expand as the channels approach the outer edge.

8. The package of claim 1, wherein the interposer is made out of a thermally conductive material.

9. The package of claim 1, wherein the interposer functions as a heat spreader for the second die.

10. The package of claim 1, further comprising an epoxy interposed between the second die and attaching to the interposer.

11. The package of claim 1, further comprising an adhesive interposed between the second die and attaching to the interposer.

12. The package of claim 1, wherein the interposer is configured to cover the first surface of the first IC die.

13. An IC package, comprising:
    a leadframe having opposing first and second surfaces, comprising:
        a centrally located die attach pad having opposing first and second surfaces, and
        a plurality of leads;
    a first IC die, having opposing first and second surfaces, coupled to the first surface of the die attach pad;
    an interposer, having opposing first and second surfaces, coupled to the first surface of the leadframe, wherein the interposer has an opening in the first surface of the interposer configured to accommodate the first IC die, wherein the interposer has a plurality of channels formed in the first surface and extending from the opening to an outer edge of the interposer and wherein the walls of the channels taper;
    a first wire bond that couples a bond pad on the first surface of the first IC die to a conductive region of the leadframe;
    a second IC die, having opposing first and second surfaces coupled to the second surface of the interposer;
    a second wire bond that couples a bond pad on the first surface of the second IC die to a conductive region of the leadframe; and
    an encapsulating material that encapsulates the first IC die, the second IC die, the interposer and the wire bonds.

14. The package of claim 13, wherein the opening in the interposer extends through the interposer to the second surface of the interposer such that the first IC die is accessible from both the first and second surfaces of the interposer.

15. The package of claim 13, wherein the conductive regions on the leadframe are finished with an electrically conductive material.

16. The package of claim 15, wherein the electrically conductive material is gold.

17. The package of claim 13, wherein the second die is attached to the second surface of the interposer with an adhesive.

18. The package of claim 13, wherein the second die is attached to the second surface of the interposer with an epoxy.

19. The IC package of claim 13, wherein the interposer is configured to cover the first surface of the first IC die.

20. An IC package, comprising:
    a leadframe having opposing first and second surfaces, comprising:
        a centrally located die attach pad having opposing first and second surfaces, and
        a plurality of leads;

a first IC die, having opposing first and second surfaces, coupled to the first surface of the die attach pad;

an interposer, having opposing first and second surfaces, coupled to the first surface of the leadframe, wherein the interposer has an opening in the first surface of the interposer configured to accommodate the first IC die, wherein the interposer has a plurality of channels formed in the first surface and extending from the opening to an outer edge of the interposer and wherein the walls of the channels taper;

a first wire bond that couples a bond pad on the first surface of the first IC die to a conductive region of the leadframe;

a second IC die, having opposing first and second surfaces, coupled to the second surface of the die attach pad;

a second wire bond that couples a bond pad on the first surface of the second IC die to a conductive region of the leadframe; and an encapsulating material that encapsulates the first IC die, the second IC die, the interposer and the wire bonds.

21. The package of claim 20, wherein the opening in the interposer extends through the interposer to the second surface of the interposer such that the first IC die is accessible from both the first and second surfaces of the interposer.

22. The package of claim 20, wherein the die attach pad is not coplanar with the leads.

23. The package of claim 20, wherein the interposer encapsulates a wire bond the couples a bond pad on the first surface of the first IC die to a conductive region on the first surface of the leadframe, whereby the wire bond is protected from damage.

24. The IC package of claim 20, the interposer is configured to cover the first surface of the first IC die.

* * * * *

UNITED STATES PATENT AND TRADEMARK OFFICE
CERTIFICATE OF CORRECTION

| | |
|---|---|
| PATENT NO. | : 8,183,687 B2 |
| APPLICATION NO. | : 11/707026 |
| DATED | : May 22, 2012 |
| INVENTOR(S) | : Rezaur Rahman Khan et al. |

It is certified that error appears in the above-identified patent and that said Letters Patent is hereby corrected as shown below:

Column 12, Line 10, please replace "bond the couples" with --bond that couples--.

Column 12, Line 14, please replace "the interposer" with --wherein the interposer--.

Signed and Sealed this
Seventeenth Day of July, 2012

David J. Kappos
*Director of the United States Patent and Trademark Office*